United States Patent [19]

Diller

[11] Patent Number: 4,489,270

[45] Date of Patent: Dec. 18, 1984

[54] COMPENSATION OF A HIGH VOLTAGE ATTENUATOR

[75] Inventor: Calvin D. Diller, Beaverton, Oreg.

[73] Assignee: Tektronix, Inc., Beaverton, Oreg.

[21] Appl. No.: 464,283

[22] Filed: Feb. 7, 1983

[51] Int. Cl.³ .............................. G05F 3/08; H01P 1/22
[52] U.S. Cl. ................................ 323/354; 340/347 CC
[58] Field of Search .................... 323/297, 352–354; 340/347 M, 347 AD, 347 DA, 347 CC; 333/81 R

[56] References Cited

U.S. PATENT DOCUMENTS

| | | | |
|---|---|---|---|
| 3,011,132 | 11/1961 | Hinrichs et al. | 323/354 X |
| 3,566,252 | 2/1971 | Nercessian | 323/297 X |
| 4,138,637 | 2/1979 | Weinert | 323/354 |
| 4,280,089 | 7/1981 | van de Plassche et al. | 323/354 |

Primary Examiner—Peter S. Wong
Attorney, Agent, or Firm—Allston L. Jones; George T. Noe

[57] ABSTRACT

A high voltage attenuator is discussed which includes a divider having a signal input line and a plurality of signal output lines for providing an attenuated electrical signal on a selected one of the signal output lines in response to a switching control signal. A compensation means is also coupled to said divider means to provide signal compensation to the attenuated electrical signal in response to the switching control signal, together with switching control means coupled to the divider means to provide the switching control signal.

6 Claims, 2 Drawing Figures

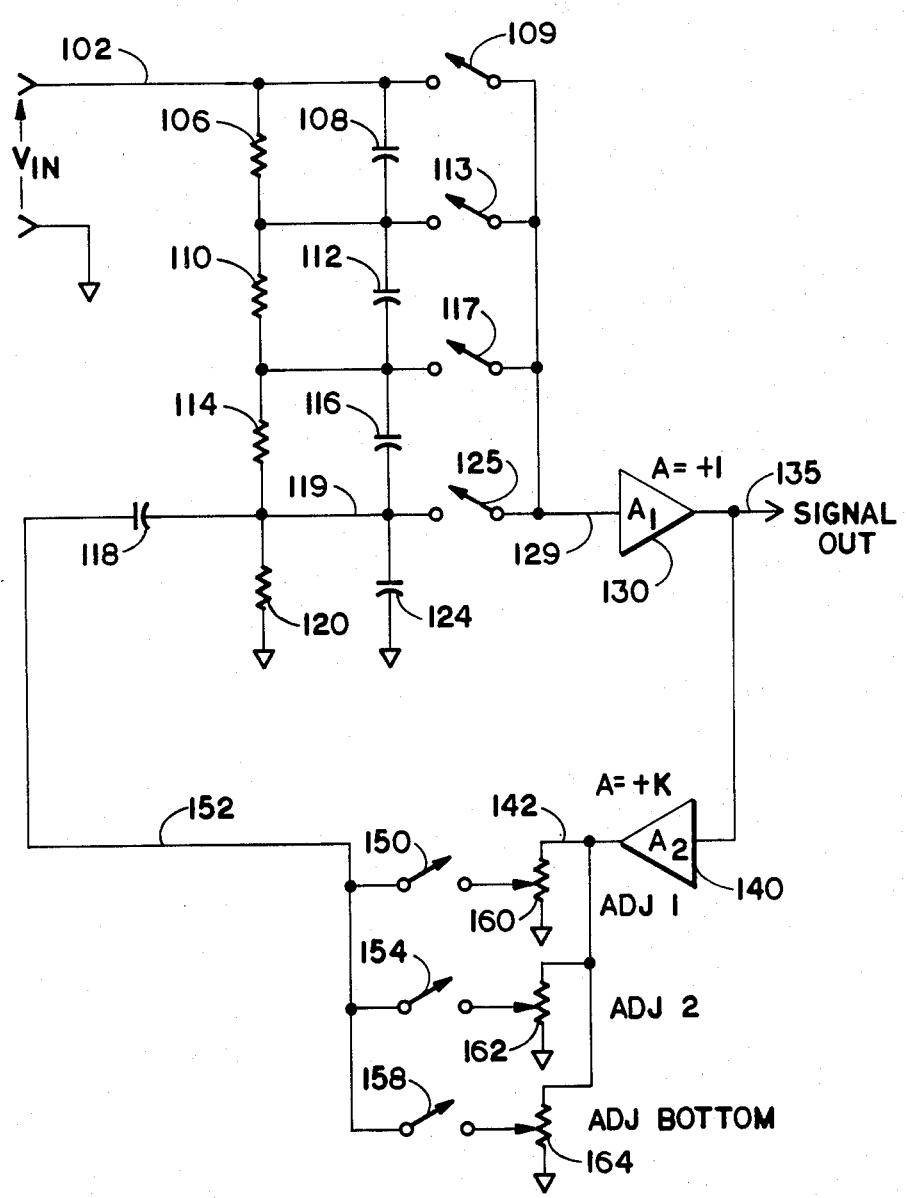
FIG_1_

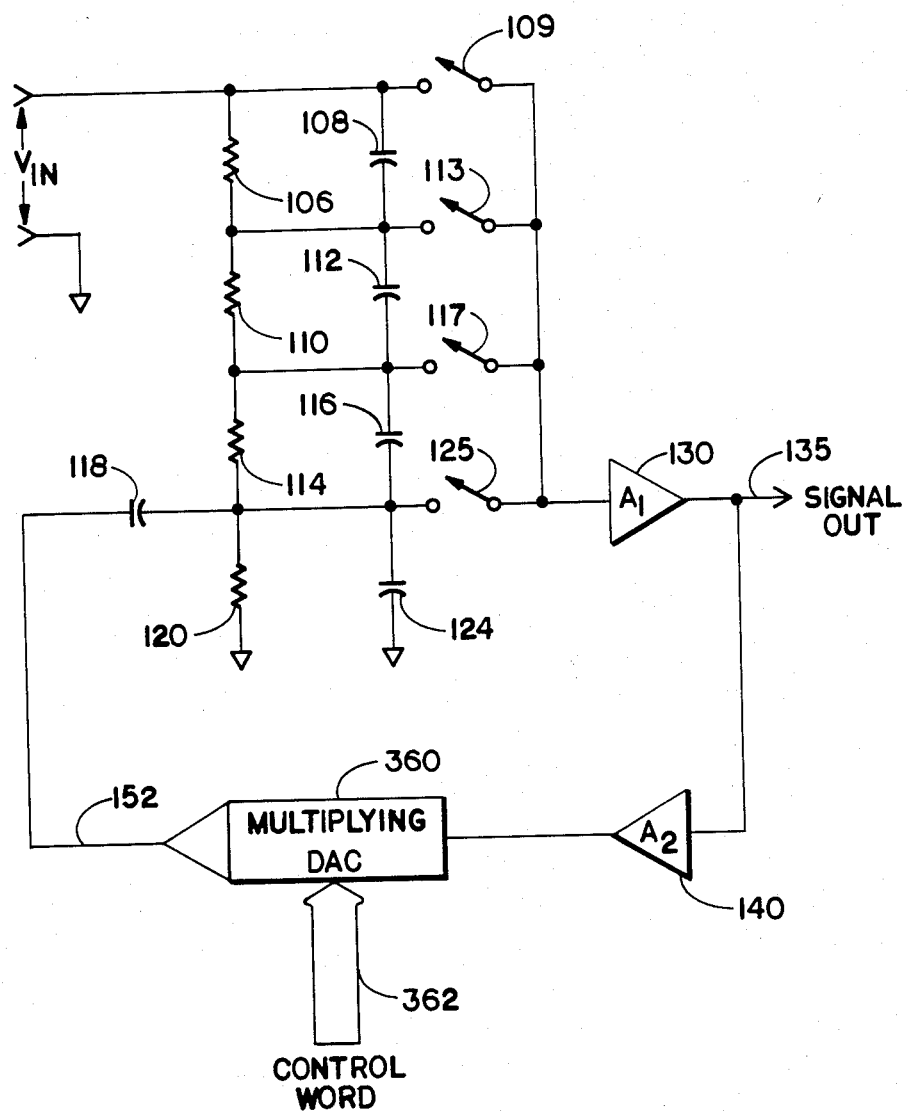
FIG_2_

COMPENSATION OF A HIGH VOLTAGE ATTENUATOR

BACKGROUND OF THE INVENTION

The present invention relates to attenuators and more particularly decade attenuators.

In traditional decade attenuators with multiple taps, compensation for the interaction between steps is difficult to impossible to compensate for. Variable capacitors have been utilized in the prior art attenuators but they perform poorly in extreme environments and they are sensitive to high volume production processes. These capacitors and special high voltage switches for use for high voltage attenuation are quite expensive and bulky.

In accordance with the preferred embodiment of the present invention, an attenuating divider circuit provides signal compensation by a compensation signal which varies with the divider output selected. The basic RC compensation provided for each attenuator path is fine-tuned by this compensation signal which varies with the divider output, i.e. attenuating path, selected. The adjustments in compensation can be accomplished by various techniques which cause the compensation signal to assume the desired electrical characteristics as the various attenuator paths are selected. In the preferred embodiment, variable resistors are provided as alternate paths for the compensating signal in response to the selection of the corresponding signal attenuation path in the divider.

The compensating signal is provided to a common electrical point of the divider via an additional signal compensation circuit element. The particular resistance value selected in combination with this additional signal compensation element, e.g. a capacitor, acts in shunt with compensation elements in the divider circuit to achieve a desired combined RC value for that attenuation path and thus provide the high frequency signal compensation of the output signal.

BRIEF DESCRIPTION OF THE DRAWING

FIG. 1 is a circuit diagram of a first attenuator divider circuit with signal compensation in accordance with the preferred embodiment.

FIG. 2 is a circuit diagram of a second attenuator divider circuit with high frequency compensation in accordance with the preferred embodiment.

DESCRIPTION OF THE PREFERRED EMBODIMENT

An input signal is received on a line 102. The signal on line 102 is selectively switched to line 129 via one of switches 109, 113, 117, or 125. If switch 109 is activated then no attenuation of the input signal occurs between line 102 and line 129. Successively greater attenuation of the signal on line 102 occurs if switch 113, 117, or 125 (in that order) is selected. This is because of the divider formed by resistors 106, 110, 114, and 120. In this circuit, the greatest attenuation occurs if switch 125 is selected and the attenuation is, of course, determined by the specific resistor values selected for resistors 106, 110, 114 and 120.

Capacitor 124 and capacitors 108, 112 and 116 (if they are electrically included in the circuit because of the activation of switches 125, 117 or 113) provide high frequency signal compensation by formation of the appropriate RC network with resistors 106, 110, 114 and 120.

While adjustment of component values for optimum frequency compensation for one attenuation path would seem readily achievable, it should be noted that variation of the component values to effect the desired compensation at one attenuation path of the divider will effect the compensation at other nodes because of the interdependence and interreaction of the node circuit elements. Therefore, the fine tuning of the frequency compensation for each attenuation level is best achieved in a manner which is independently adjustable for each attenuation path. Furthermore, a desirable attribute of such a compensation scheme would be operation at low voltages which were capable of semiconductor operation so that the use of electromechanical relays is not required as with previous techniques.

The fine tuning compensation technique of the preferred embodiment will now be explained. For initial discussion purposes it will be assumed that switch 150 is closed and resistor 160 is set to zero ohms of resistance between lines 142 and 152. The voltage divider output signal on line 129 drives unity gain amplifier 130 which provides the signal output on line 135. This output signal on line 135 in turn drives non-inverting amplifier 140 which has a gain of K. Amplifier 140 drives signal junction 119 through capacitor 118.

The effect of amplifier 140, since R160 (in this instance) is set to pass all of the signal, is dependent on its gain, K. If K is zero, then the output of amplifier 140 on line 142 will also be zero and hence capacitor 118 will act in parallel with capacitor 124. If K of amplifier 140 is set to one, the output signal on lines 142 and 152 will match the value of the input signal at the input of amplifier 140. There will be a zero voltage drop across capacitor 118 and therefore it will have no effect on the circuit operation. Similarly, if the gain of amplifier 140 is set to 2, the effect of capacitor 124 will be diminished by an amount equal to capacitor 118. In general:

$$\text{Capacitance 124 effective} = \text{Capacitance 118} + \text{Capacitance 124} (1 - K)$$

As illustrated above, network compensation can be accomplished by varying the effective capacitance of capacitors 118 and 124. One technique in accordance with the preferred embodiment would be to vary the gain, K, of amplifier 140. Alternatively, the effective gain of amplifier 140 can be preadjusted by the use of potentiometers 160, 162, and 164 which are switched into the circuit by closing the appropriate form A switch 150, 154, or 158, respectively. The selected switch 113, 117, or 125 is closed concurrently with the closing of switch 150, 154, or 158, respectively.

For example, when selecting the attenuation path by closing switch 117, switch 154 is also closed to allow adjustment of the compensation via variable resistor 162. In this case, the gain of amplifier 140 remains fixed at a level which is sufficient to allow suitable adjustment over the resistance ranges of variable resistors 160, 162, and 164. The adjustment of the variable resistor 160, 162, or 164 in the circuit has precisely the same effect as varying the gain of amplifier 140. The resistance values of resistors 160, 162, and 164 are chosen to be small enough so that the loading effects of capactior 118 take place at frequencies well above the intended frequency range of intended operation.

As different nodes are selected, via switches 125, 117, 113, and 109 the compensation signal provided through capacitor 118 continues to propagate upward through the divider, having no effect however if the zero attenuation path is selected via switch 109.

To more clearly envision this, imagine that the divider circuit attenuates in decade steps and the input is grounded, i.e. no input signal is present. A compensation signal on line 152 will enter the bottom divider node 119 via capacitor 118. Assume further that such signal has a level of one volt. One can assume that the RC time constants of each section are substantially equal to begin with since RC time constant matching of each section is a primary objective of the attenuator design.

With these assumptions in mind, the compensating signal level at the node between capacitors 112 and 116 will be 0.99 Volts while it will be 0.9 V at the node between capacitors 108 and 112. Thus 90% of the compensating signal is still effective at the most remote node for which compensation is being provided.

In general, the compensation at any divider tap can be approximately calculated by knowing the gain of amplifier 140, the capacitance of capacitors 118 and 124, and the network attenuation ratio from the bottom tap to the selected tap of the divider. The formula is:

$$\text{Range} = K \times C_{118}/(C_{124} + C_{118})$$

Parasitic capacitances will effect the actual response of the network.

It should be noted that the entire circuit works at semiconductor device level voltages so that the switches indicated in the circuit diagrams can be fabricated using semiconductor techniques, i.e. the actual switches used could be CMOS devices rather than mechanical switches or relays.

An alternative to the above use of form A switches is shown in FIG. 2. In this circuit, the output of amplifier 140 is attenuated by a multiplying digital to analog converter 360 which provides the compensating signal on line 152. The digital control word received on line 362 which can be provided by a microprocessor or digital controller is used to program DAC 360 for some gain between zero and one. The signal from amplifier 140 is thus effectively multiplied by a proportional amount specified by the digital control word on bus 362. In a practical system, the same control computer would also specify the switch (109, 113, 117, or 125) which is to be closed, so for each range change, a corresponding compensation digital control word would be transmitted to DAC 360.

The following guidelines are useful in choosing element values in the application of these compensation methods. Adjustment range is given by the formula set forth above. It should be set by first making K (the fixed gain of amplifier 140) as large as practical and then choosing just enough capacitance for capacitor 118 to give acceptable adjustment range.

Section time constants should be chosen such that compensation capacitance dominates the divider performance at frequencies well below those where stray capacitance would affect the performance of the resistive divider by itself. Capacitor 124 is diminished in capacitance value from that predicted by an amount equal to the capacitance chosen for capacitor 118. This maintains the proper total time constant with both capacitors acting upon the bottom node. Stray capacitance including load and relay bridging capacitance if relays are used, can be nominally accounted for with slight adjustment of compensating element values. Since changing one element value affects the midband response flatness at all nodes, it is best to first analyze a proposed configuration using computer modeling or some other network analysis technique to predict node response sensitivities to element variations. Quick optimization may then be achieved.

I claim:

1. A compensated attenuator, comprising:
   a divider comprising a plurality of impedance elements for providing a plurality of selectable attenuation paths between a signal input line and a signal output line; and
   compensation means coupled to said divider and being responsive to an output signal on said signal output line to vary the effective divider impedance dynamically.

2. An attenuator in accordance with claim 1 wherein said compensation means comprises a capacitor coupled to said divider, and an amplifier coupled between said signal output line and said capacitor.

3. An attenuator in accordance with claim 2 wherein said compensation means further includes means for selectively modifying the gain of said amplifier to selectively adjust the compensation for at least one of said selectable attenuation paths.

4. An attenuator in accordance with claim 3 wherein said means for selectively modifying the gain of said amplifier comprises variable-tap resistor means connected between the output of said amplifier and ground, wherein said tap is connected to said capacitor.

5. An attenuator in accordance with claim 3 wherein said means for selectively modifying the gain of said amplifier comprises a multiplying digital-to-analog converter coupled between the output of said amplifier and said capacitor.

6. An attenuator in accordance with claim 5 wherein said multiplying digital-to-analog converter is programmable to provide said gain modification.

* * * * *

UNITED STATES PATENT AND TRADEMARK OFFICE
CERTIFICATE OF CORRECTION

PATENT NO. : 4,489,270
DATED : December 18, 1984
INVENTOR(S) : Calvin D. Diller

It is certified that error appears in the above—identified patent and that said Letters Patent is hereby corrected as shown below:

Column 1, line 24, reads "i.e. attenuating" should be --i.e. the attenuating--.

Column 2, line 43, reads "118 + Capacitance 124 (1 - K)" should be --124 + Capacitance 118 (1 - K)--.

Signed and Sealed this

Twenty-second Day of October 1985

[SEAL]

Attest:

DONALD J. QUIGG

Attesting Officer

Commissioner of Patents and
Trademarks—Designate